(12) United States Patent
Murai

(10) Patent No.: US 9,368,480 B2
(45) Date of Patent: Jun. 14, 2016

(54) SEMICONDUCTOR DEVICE AND METHOD OF MANUFACTURING SEMICONDUCTOR DEVICE

(71) Applicant: Sony Corporation, Tokyo (JP)

(72) Inventor: Makoto Murai, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/549,792

(22) Filed: Nov. 21, 2014

(65) Prior Publication Data

US 2015/0179614 A1 Jun. 25, 2015

(30) Foreign Application Priority Data

Dec. 19, 2013 (JP) ................................ 2013-262348

(51) Int. Cl.
*H01L 23/48* (2006.01)
*H01L 25/065* (2006.01)
(Continued)

(52) U.S. Cl.
CPC .......... *H01L 25/0657* (2013.01); *H01L 21/563* (2013.01); *H01L 23/3121* (2013.01); *H01L 25/0652* (2013.01); *H01L 25/50* (2013.01); *H01L 24/73* (2013.01); *H01L 2224/0345* (2013.01); *H01L 2224/0401* (2013.01); *H01L 2224/04042* (2013.01);
(Continued)

(58) Field of Classification Search
CPC .......... H01L 2224/16145; H01L 2224/32145; H01L 2224/73204; H01L 2924/00; H01L 2924/00012; H01L 2924/3512; H01L 21/563; H01L 2224/26145; H01L 2224/26175; H01L 2224/27013; H01L 2224/73203; H01L 2224/08; H01L 2224/83102; H01L 2224/92125; H01L 24/28; H01L 24/32; H01L 2924/01005; H01L 2924/01006; H01L 2924/01033; H01L 2924/01082; H01L 2924/14
USPC ........... 257/782–784, 787, 789; 438/106, 108
See application file for complete search history.

(56) References Cited

U.S. PATENT DOCUMENTS 6,291,264 B1 * 9/2001 Tang ..................... H01L 21/563
257/E21.503
6,708,398 B2 * 3/2004 Wakashima .......... H01L 21/486
257/E23.069

(Continued)

FOREIGN PATENT DOCUMENTS

| JP | 2005-276879 A | 10/2005 |
| JP | 2010-073949 A | 4/2010 |
| JP | 2010073949 | * 4/2010 |

OTHER PUBLICATIONS

U.S. Appl. No. 14/549,792, Mohammed Shamsuzzaman.*

*Primary Examiner* — Mohammed Shamsuzzaman
(74) *Attorney, Agent, or Firm* — Michael Best & Friedrich LLP

(57) ABSTRACT

Provided is a semiconductor device, including: a first substrate that includes a first wiring; a second substrate that is disposed facing the first substrate and includes a second wiring, the second wiring being connected to the first wiring through a connection terminal, and the second substrate being smaller in area than the first substrate; a first resin layer that is filled in a gap between the first substrate and the second substrate and covers a region, on the first substrate, in an outer periphery of the second substrate; an organic film pattern that is provided on the first substrate and surrounds the first resin layer; and a second resin layer that covers the first substrate, the organic film pattern, the first resin layer, and the second substrate.

16 Claims, 14 Drawing Sheets

(51) Int. Cl.
*H01L 25/00* (2006.01)
*H01L 23/31* (2006.01)
*H01L 21/56* (2006.01)
*H01L 23/00* (2006.01)

(52) U.S. Cl.
CPC .......... *H01L 2224/0557* (2013.01); *H01L 2224/05567* (2013.01); *H01L 2224/05624* (2013.01); *H01L 2224/05647* (2013.01); *H01L 2224/06181* (2013.01); *H01L 2224/16145* (2013.01); *H01L 2224/16225* (2013.01); *H01L 2224/17181* (2013.01); *H01L 2224/26145* (2013.01); *H01L 2224/26175* (2013.01); *H01L 2224/32145* (2013.01); *H01L 2224/32225* (2013.01); *H01L 2224/45144* (2013.01); *H01L 2224/45147* (2013.01); *H01L 2224/45464* (2013.01); *H01L 2224/48091* (2013.01); *H01L 2224/48227* (2013.01); *H01L 2224/48465* (2013.01); *H01L 2224/48824* (2013.01); *H01L 2224/48847* (2013.01); *H01L 2224/49171* (2013.01); *H01L 2224/73204* (2013.01); *H01L 2224/73207* (2013.01); *H01L 2224/73253* (2013.01); *H01L 2224/73265* (2013.01); *H01L 2224/81193* (2013.01); *H01L 2224/92125* (2013.01); *H01L 2225/0651* (2013.01); *H01L 2225/06513* (2013.01); *H01L 2225/06517* (2013.01); *H01L 2225/06541* (2013.01); *H01L 2225/06568* (2013.01); *H01L 2924/15313* (2013.01)

(56) References Cited

U.S. PATENT DOCUMENTS

| | | | | |
|---|---|---|---|---|
| 7,042,106 B2* | 5/2006 | Lu | ............ | G02B 6/4214 257/789 |
| 7,244,634 B2* | 7/2007 | Suh | ............ | H01L 23/49816 257/E21.514 |
| 7,359,211 B2* | 4/2008 | Landeros | ............ | B23K 1/0016 361/760 |
| 8,106,521 B2* | 1/2012 | Iwase | ............ | H01L 21/563 257/778 |
| 8,404,517 B2* | 3/2013 | Sakata | ............ | H01L 21/563 438/108 |
| 8,952,552 B2* | 2/2015 | Zang | ............ | H01L 21/563 257/737 |
| 2002/0060084 A1* | 5/2002 | Hilton | ............ | H01L 21/563 174/523 |
| 2004/0066693 A1* | 4/2004 | Osako | ............ | B29C 45/14655 365/222 |
| 2004/0118599 A1* | 6/2004 | Chason | ............ | B81C 1/00333 174/260 |
| 2005/0194695 A1* | 9/2005 | Lin | ............ | H01L 24/11 257/777 |
| 2007/0289777 A1* | 12/2007 | Pendse | ............ | H01L 23/3128 174/520 |
| 2008/0237895 A1* | 10/2008 | Saeki | ............ | H01L 23/3157 257/787 |
| 2011/0147912 A1* | 6/2011 | Karpur | ............ | H01L 21/563 257/687 |

* cited by examiner

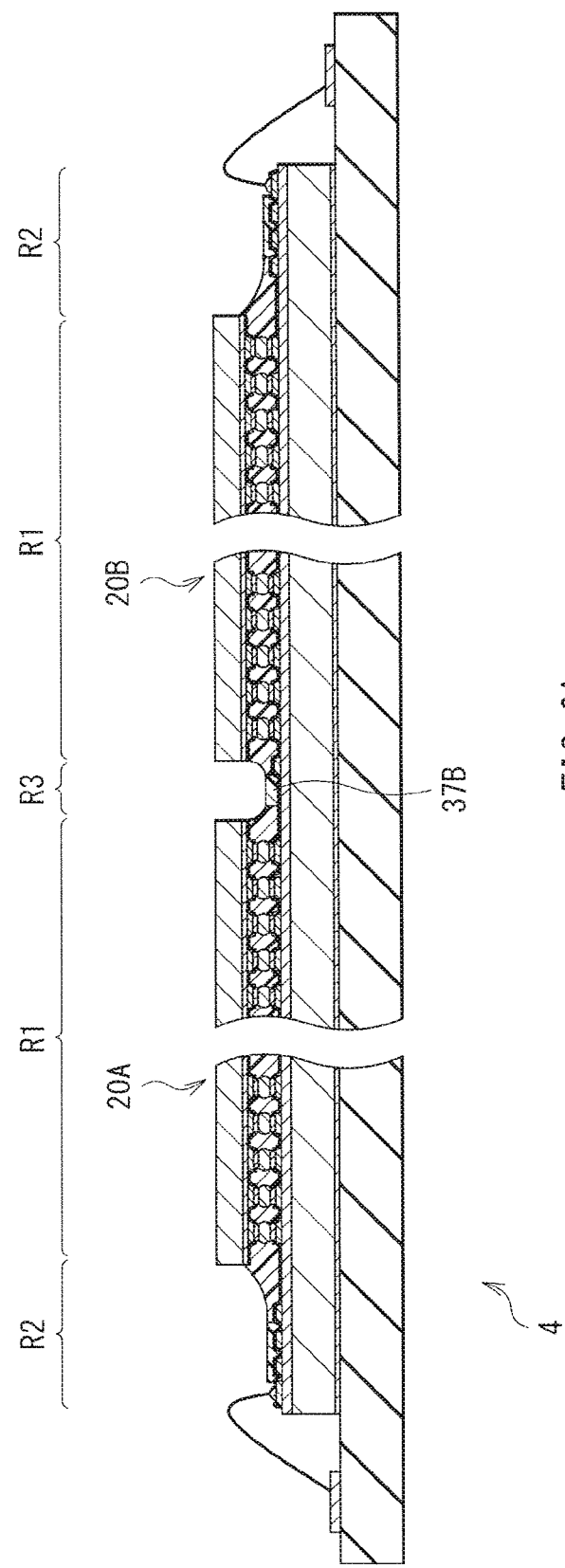

SEMICONDUCTOR DEVICE AND METHOD OF MANUFACTURING SEMICONDUCTOR DEVICE

CROSS REFERENCE TO RELATED APPLICATIONS

This application claims the benefit of Japanese Priority Patent Application JP 2013-262348 filed on Dec. 19, 2013, the entire contents of which are incorporated herein by reference.

BACKGROUND

The present disclosure relates to a semiconductor device having a configuration in which two or more semiconductor chips are stacked, and a method of manufacturing the semiconductor device.

There has been known a flip chip mounting technology in which a semiconductor chip and a circuit board are arranged face to face, or two semiconductor chips are arranged face to face, and connected electrically and mechanically using a connection terminal called a bump. The flip chip mounting technology is suitable for densification, size reduction, high speed acceleration, and lower power consumption of a semiconductor device.

In a semiconductor device formed by the flip chip mounting technology, an underfill resin is sealed in a gap between a semiconductor chip and a circuit board, or in a gap between semiconductor chips, for the purpose of bump protection and so on (for example, see Japanese Unexamined Patent Application Publication No. 2005-276879). In a manufacturing process of the semiconductor device, the underfill resin enters the gap between the semiconductor chip and the circuit board or the gap between the semiconductor chips by, for example, a capillary phenomenon. However, in some cases, the underfill resin may fail in entering the gap between the semiconductor chip and the circuit board or the gap between the semiconductor chips to flow out to the periphery. Accordingly, there is proposed a technology of providing, on a surface of the semiconductor chip or the circuit board, a dam structure that prevents an outflow of the underfill resin (for example, see Japanese Unexamined Patent Application Publication No. 2010-73949).

SUMMARY

However, in Japanese Unexamined Patent Application Publication No. 2010-73949, the dam is formed together with the bump in a same plating process. In this case, since the dam is formed as a plated film over a relatively broad area, a large stress is likely to occur between the dam and a protective film on a surface of the semiconductor chip. As a result, there is a possibility of occurrence of a crack in the protective film on the surface of the semiconductor chip. Moreover, in a bump reflow process, the dam, which is formed in the same process as the bump, also melts. In a case that a radius of curvature of a corner section of the dam is small, a melted dam material concentrates in the corner section due to surface tension, which may cause a remarkable increase in variation of dam height in the semiconductor chip. Further, since the dam also melts in a reflow process after package assembly, in a case that there is a slight gap between the surface of the semiconductor chip and a molding material, there is concern over disadvantages such as occurrence of a short circuit between pads.

It is desirable to provide a semiconductor device that makes it possible to enhance operation reliability or long-term reliability and is suited for high integration, and a method of manufacturing the semiconductor device.

According to an embodiment of the present disclosure, there is provided a semiconductor device including: a first substrate that includes a first wiring; a second substrate that is disposed facing the first substrate and includes a second wiring, the second wiring being connected to the first wiring through a connection terminal, and the second substrate being smaller in area than the first substrate; a first resin layer that is filled in a gap between the first substrate and the second substrate and covers a region, on the first substrate, in an outer periphery of the second substrate; an organic film pattern that is provided on the first substrate and surrounds the first resin layer; and a second resin layer that covers the first substrate, the organic film pattern, the first resin layer, and the second substrate.

According to an embodiment of the present disclosure, there is provided a method of manufacturing a semiconductor device, the method including: forming, on a first substrate that includes a first wiring, an organic film pattern that includes an opening; connecting the first wiring to a second wiring of a second substrate through a connection terminal, the second substrate being disposed in a region, on the first substrate, that faces the opening of the organic film pattern; filling a first resin layer in a gap between the first substrate and the second substrate; and forming a second resin layer that covers the first substrate, the organic film pattern, the first resin layer, and the second substrate.

In the semiconductor device and the method of manufacturing the semiconductor device according to the above-described embodiments of the present disclosure, the organic film pattern is provided surrounding the first resin layer that is filled in the gap between the first substrate and the second substrate. Therefore, the organic film pattern functions as a dam in a manufacturing process, preventing an outflow of the first resin layer in the manufacturing process.

Though the second resin layer has a compression stress due to curing shrinkage, the organic film pattern has a high affinity with the second resin layer. Accordingly, adhesion of the second resin layer and the organic film pattern is enhanced. Consequently, adhesion of the first substrate and the second resin layer is enhanced, as compared to a case that a dam made of metal is formed by plating or the like on the first substrate.

Moreover, providing the organic film pattern on the first substrate contributes to reduction in area where the first substrate is in direct contact with the second resin layer. Accordingly, the first substrate is less likely to be affected by the stress due to curing shrinkage of the second resin layer. Moreover, the second resin layer often contains fillers for enhancement of thermal conductivity. In this case, providing the organic film pattern on the first substrate allows damage to the first substrate caused by the fillers contained in the second resin layer to be relieved.

In addition, no organic film pattern is provided in a region where the first substrate and the second substrate overlap. This makes it possible to enhance a heat dissipation characteristic, as compared to a case that the organic film pattern is formed entirely, and to avoid an increase in thickness of an entire structure.

Moreover, in a case that the dam is formed with a plated film using a solder material, there is a possibility of damage to a protective film as an uppermost layer of the first substrate due to stress in forming the plated film, causing a crack. Further, there is concern over a short circuit of lead-out electrodes on the first substrate, which may be caused by melting of the plated film at the time of reflow. However, in the semiconductor device according to the above-described embodiment of the present disclosure, such disadvantages are avoided.

According to the semiconductor device and the method of manufacturing the semiconductor device in the above-described embodiments of the present disclosure, it is possible to secure excellent operation reliability or long-term reliability and to pursue high integration. It is to be noted that effects of the present disclosure are not limited to those described here, but may be any of effects described in the followings.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 6A is a cross-sectional view illustrating one configuration example of a semiconductor device according to a fourth embodiment of the present disclosure.

DETAILED DESCRIPTION

In the following, some embodiments of the present disclosure will be described in detail with reference to the accompanying drawings. It is to be noted that description will be made in the following order.

1. First Embodiment (a semiconductor device having a basic configuration)
2. Second Embodiment (a semiconductor device provided with a double dam structure)
3. Third Embodiment (a semiconductor device having a configuration in which a width of an opening is partly broadened)
4. Fourth Embodiment (a semiconductor device having a configuration in which a semiconductor chip on an upper side is divided in a plurality)
5. Fifth Embodiment (a semiconductor device provided with a guide structure in a region where an underfill resin is filled)

First Embodiment

Configuration of Semiconductor Device 1

Figure 1A:
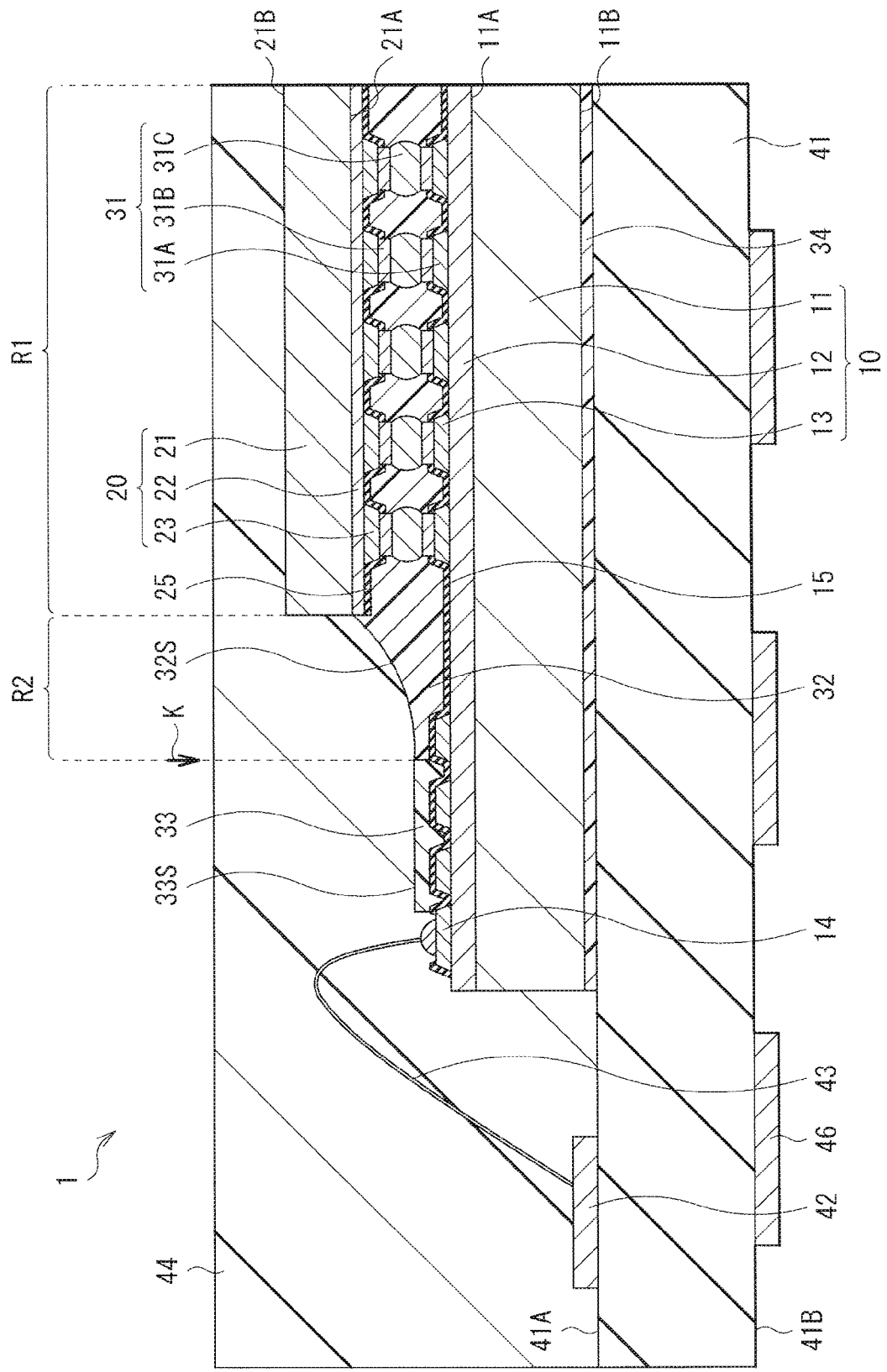
FIG. 1A is a cross-sectional view illustrating one configuration example of a semiconductor device according to a first embodiment of the present disclosure.
Figure 1B:
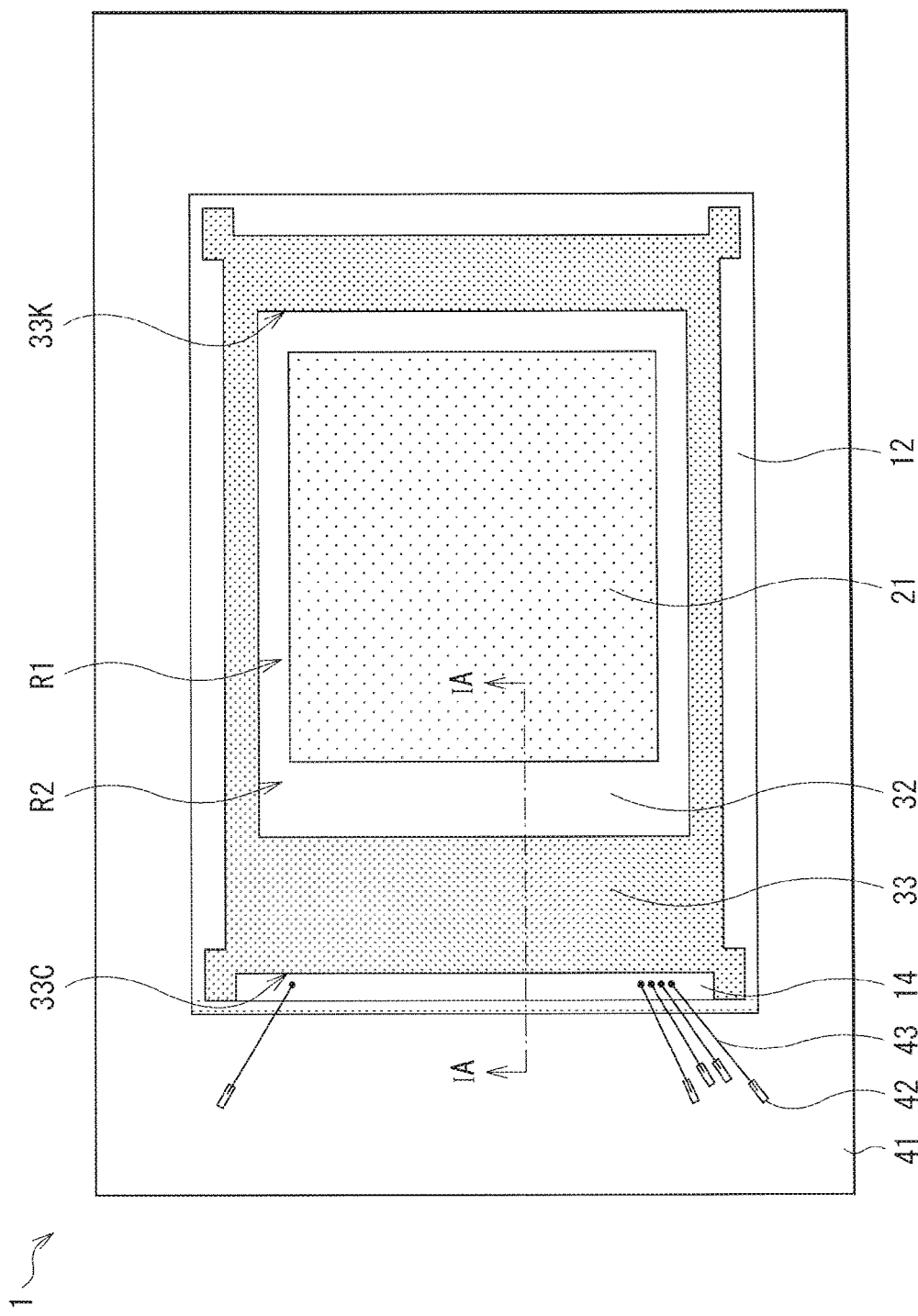
FIG. 1B is a plan view illustrating one configuration example of the semiconductor device illustrated in FIG. 1A.

FIG. 1A illustrates a cross-sectional configuration of a semiconductor device 1 according to a first embodiment of the present disclosure. FIG. 1B illustrates a planar configuration of the semiconductor device 1. FIG. 1A corresponds to a cross-section along a cutting line IA-IA illustrated in FIG. 1B, as seen in the direction of the arrows.

The semiconductor device 1 may have, for example, a chip on chip (COC) configuration in which a semiconductor chip 10 and the semiconductor chip 20 are arranged face to face and connected through a connection terminal 31 called a bump.

The semiconductor chip 10 may include a semiconductor substrate 11, a circuit forming layer 12, a wiring 13, and a protective film 15 as an uppermost layer. The circuit forming layer 12 covers a front surface 11A of the semiconductor substrate 11. The wiring 13 is provided on the circuit forming layer 12. The semiconductor chip 20 may include a semiconductor substrate 21, a circuit forming layer 22, a wiring 23, a protective film 25 as an uppermost layer. The circuit forming layer 22 covers a front surface 21A of the semiconductor substrate 21. The wiring 23 is provided on the circuit forming layer 22. The semiconductor substrates 11 and 21 may be configured of, for example, single crystal silicon. The circuit forming layers 12 and 22 are layers where semiconductor circuits having transistors (not illustrated) including an impurity diffusion layer are formed. The semiconductor substrates 11 and 21 may have a planar configuration of, for example, a rectangular shape as illustrated in FIG. 1B, and occupied area by the semiconductor substrate 21 is smaller than occupied area by the semiconductor substrate 11. Further, in the front surface 11A of the semiconductor substrate 11, in a part of a region other than an opposite region R1 that faces the semiconductor chip 20, a lead-out electrode 14 may be provided for external connection of a circuit in the circuit forming layer 12. The wiring 13 and 23, and the lead-out electrode 14 may be configured of, for example, a high conductivity material such as Cu (copper) or an Al—Cu alloy, or the like, and may be formed by, for example, a sputtering method.

The circuit forming layer 12 and the wiring 13 may be covered by the protective film 15. However, a part (for example, an upper surface) of the wiring 13 that is provided in the opposite region R1 may be exposed without being covered by the protective film 15. In other words, the protective film 15 may be provided with one or more openings. The upper surface of the wiring 13 may be covered with, for example, a barrier metal 31A (which will be described later). Here, between the wiring 13 and the barrier metal 31A, a barrier film and a seed film may be stacked in this order from the wiring 13 side. As the barrier film, a metal film such as Ti (titanium) or Ti—W (a titanium tungsten alloy) may be used. On the other hand, as the seed film, for example, a Cu film may be adopted. A thickness of the barrier film may be, for example, 100 nm, while a thickness of the seed film may be, for example, 300 nm. Moreover, an upper surface of the lead-out electrode 14 may be exposed for connection to a lead wire 42 through a wire 43, without being covered by the barrier film and the seed film as mentioned above as well as the protective film 15.

Similarly, the circuit forming layer 22 and the wiring 23 in the semiconductor chip 20 may be covered by the protective film 25. However, a part (for example, an upper surface) of the wiring 23 that is provided in the opposite region R1 may be exposed without being covered by the protective film 25. In other words, the protective film 25 may be provided with one or more openings. The upper surface of the wiring 23 may be covered with, for example, a barrier metal 31B (which will be described later). Also between the wiring 23 and the barrier metal 31B, the barrier film and the seed film as mentioned above may be stacked in this order.

The protective films 15 and 25 may be configured of, for example, silicon nitride or silicon oxide. The protective films 15 and 25 may be a layered film of one or more silicon nitride films and one or more silicon oxide films that are stacked alternatively. In this case, it is desirable that an uppermost layer be a silicon nitride film.

The wiring 13 and the wiring 23 are connected electrically and mechanically through the connection terminal 31. The connection terminal 31 may include the barrier metal 31A, the barrier metal 31B, and a solder layer 31C. The barrier metal 31A covers the upper surface of the wiring 13. The barrier metal 31B covers the upper surface of the wiring 23. The solder layer 31C connects the barrier metal 31A and the barrier metal 31B. The barrier metals 31A and 31B may be configured of, for example, Ni (nickel), and may have a thickness of, for example, about 3 μm. The solder layer 31C may be configured of, for example, a solder material that contains one or more constituent elements such as Sn (tin), Ag (silver), and Cu.

In a gap between the semiconductor chip 10 and the semiconductor chip 20, a sealing resin layer 32 is filled. The sealing resin layer 32 covers not only the opposite region R1 but also a region, on the semiconductor chip 10, in an outer periphery of the semiconductor chip 20 (a peripheral region R2). The sealing resin layer 32 may be configured of, for example, a thermosetting resin such as an epoxy-based resin. Further, in the thermosetting resin, fillers whose main component is a silicon oxide such as $SiO_2$ may be evenly dispersed. This is for allowing a thermal expansion coefficient of the sealing resin layer 32 to be close to thermal expansion coefficients of the semiconductor chips 10 and 20, or for enhancing thermal conductivity. As a sealing resin that constitutes the sealing resin layer 32, a softer one than a molding resin that constitutes a molded resin layer 44 that will be described later, specifically, U8443 available from NAMICS Corporation, may be suitable.

On the semiconductor chip 10, a dam 33 made of an organic film is provided surrounding the sealing resin layer 32. The dam 33 has a function of blocking the sealing resin layer 32 in a manufacturing process of the semiconductor device 1 to prevent an outflow of the sealing resin layer 32. Examples of constituent materials of the dam 33 may include a photosensitive polyimide resin such as PW-1500 (Toray Industries, Inc.). A thickness of the dam 33 may be sufficiently thinner than a dimension of a gap between the semiconductor chip 10 and the semiconductor chip 20, i.e. a thickness of the connection terminal 31; specifically, about 3 μm may be sufficient. Here, at a boundary K between the dam 33 and the sealing resin layer 32, it is desirable that a positional level of an upper surface 33S of the dam 33 coincide with a positional level of an upper surface 32S of the sealing resin layer 32. When the upper surface 33S of the dam 33 does not coincide with the upper surface 32S of the sealing resin layer 32 to form a level difference, there is a possibility that, at the time of forming the molded resin layer 44, fluidity of the molding resin is inhibited, contributing to occurrence of a void inside the molded resin layer 44. The dam 33 may be an annular organic film pattern that includes an opening 33K at a part facing the opposite region R1 and the peripheral region R2 as illustrated in FIG. 1B. The dam 33 may further include a notch 33C in a region that overlaps the lead-out electrode 14. This is for allowing the lead-out electrode 14 to be exposed. Instead of the notch 33C, an opening separate from the opening 33K may be provided.

To an opposite surface to the semiconductor chip 20 of the semiconductor substrate 11, i.e. a rear surface 11B opposite to the front surface 11A, a circuit board 41 may be attached by an adhesive layer 34. The circuit board 41 may be larger in size than the semiconductor substrate 11, and in a part of a front surface 41A of the circuit board 41, the lead wire 42 may be provided. The lead wire 42 may be connected to the lead-out electrode 14 through the wire 43. The lead wire 42 may be configured of, for example, Cu (copper) whose surface is subjected to electrolytic Ni (nickel)-Au (gold) plating, electroless Ni—Au plating, or electroless Ni—Pd (palladium)-Au plating. The wire 43 may be a lead wire made of, for example, Au or Cu, or a copper wire coated with a palladium film. On a rear surface 41B of the circuit board 41, a rear surface electrode 46 may be provided for connection to a mother board.

In the semiconductor device 1, the semiconductor chip 10, the dam 33, the sealing resin layer 32, and the semiconductor chip 20, and so on, are covered integrally by the molded resin layer 44. The molded resin layer 44 may be configured of, for example, similarly to the sealing resin layer 32, a material in which fillers whose main component is a silicon oxide such as $SiO_2$ are evenly dispersed in a thermosetting resin. As a molding resin that constitutes the molded resin layer 44, for example, CV8710 available from Panasonic Corporation may be suitable. However, it is desirable that its hardness (for example, flexural modulus) be sufficiently larger than (for example, twice or more as large as) hardness of the sealing resin. This is for sufficiently securing mechanical reliability as the semiconductor device 1.

As described above, the semiconductor device 1 has the configuration in which a most part of the semiconductor chip 10 is covered by the dam 33, the sealing resin layer 32, and the semiconductor chip 20. In other words, there hardly exists a portion where the protective film 15 is exposed, with exclusion of an outer portion of the dam 33.

[Method of Manufacturing Semiconductor Device 1]

The semiconductor device 1 may be manufactured, for example, as follows.

Figure 2A:
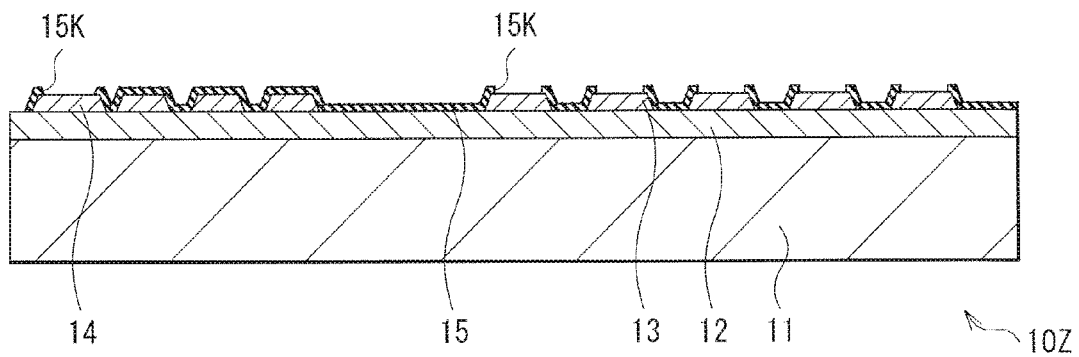
FIG. 2A is a cross-sectional view illustrating a process in a method of manufacturing the semiconductor device illustrated in FIGS. 1A and 1B.

FIGS. 2A to 2E illustrate a part of a method of manufacturing the semiconductor device 1 in the order of procedure. First, a wafer 10Z that is in a state before the semiconductor chip 10 is separated is prepared (FIG. 2A). Specifically, on the semiconductor substrate 11, the circuit forming layer 12 is formed, following which, at predetermined positions on the circuit forming layer 12, the wiring 13 and the lead-out electrode 14 are formed. Further, the protective film 15 is formed covering the entirety. At this occasion, the opening 15K is provided at a portion that faces a part of the wiring 13 and the upper surface of the lead-out electrode 14.

Figure 2B:
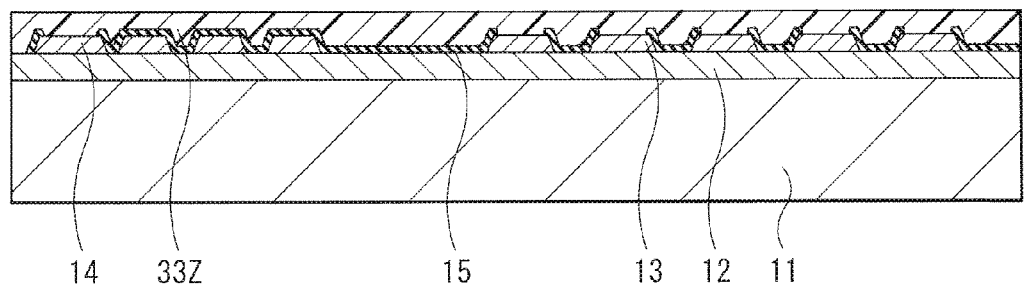
FIG. 2B is a cross-sectional view illustrating a process following FIG. 2A.
Figure 2C:
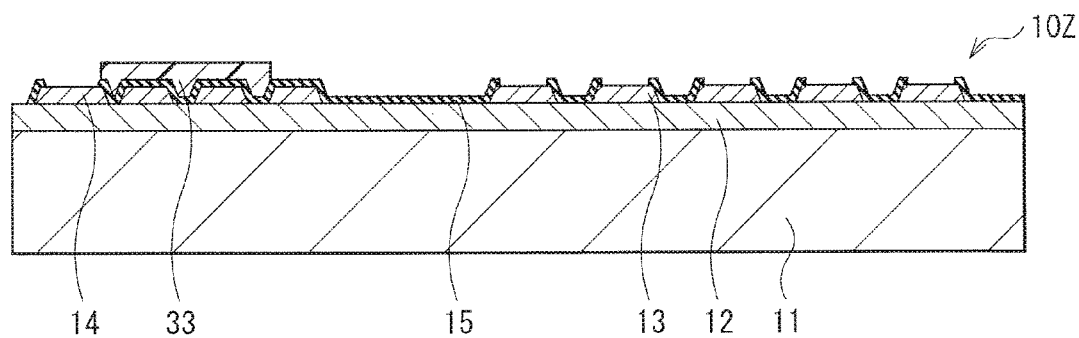
FIG. 2C is a cross-sectional view illustrating a process following FIG. 2B.

Next, an organic film 33Z is formed covering the entirety by, for example, a spin coating method. Here, for example, by controlling revolution speed of a spin coater, a predetermined resin is coated entirely to allow a thickness of the organic film 33Z to be about 3 μm to 5 μm both inclusive (FIG. 2B). After forming the organic film 33Z, heating is carried out at a temperature of, for example, 120° C. for about 3 minutes, and the organic film 33Z is patterned by, for example, photolithography. Further, the organic film 33Z thus patterned is cured at a temperature of about 250° C. and hardened. In this way, the dam 33 that is an organic film pattern having a predetermined shape is formed (FIG. 2C).

Next, after washing a surface of the wafer 10Z on which the dam 33 is formed, for example, argon reversed sputtering is carried out to remove an oxide film generated on the surfaces of the wiring 13 and the lead-out electrode 14 that are exposed without being covered by the protective film 15. Thereafter, over the entirety, the barrier film and the seed film are stacked in the order (neither illustrated) by, for example, a sputtering method.

Next, after coating a resist film entirely, an opening is formed at a predetermined position that faces a part of the wiring 13, using photolithography, to form a resist pattern (not illustrated). Then, using the resist pattern, by electrolytic plating, the barrier metal 31A is formed covering a part of the upper surface of the wiring 13. Further, on the barrier metal 31A, a solder plating layer (not illustrated), which eventually serves as the solder layer 31C, is formed.

After peeling off the resist pattern, unnecessary portions of the barrier film and the seed film are removed in the order by wet etching. In a case that titanium is used for the barrier film, ammonia hyperhydration may be used. In a case that copper is used for the seed film, a mixed liquid of citric acid and hydrogen peroxide may be used. In any cases, a liquid chemical that hardly damages a metal material that constitutes the barrier metal 31A and the solder plating layer (the solder layer 31C in the later process) may be selected.

Figure 2D:
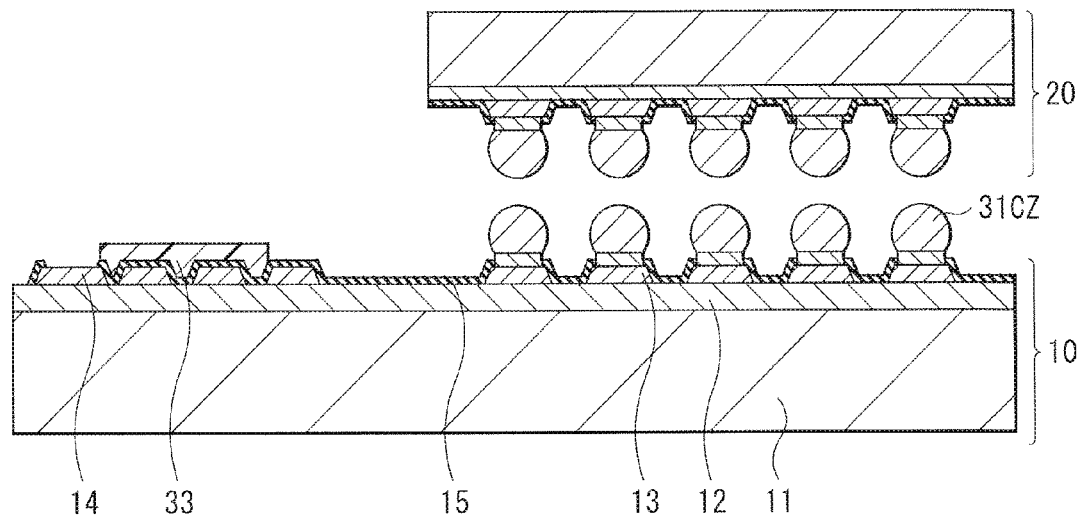
FIG. 2D is a cross-sectional view illustrating a process following FIG. 2C.

Next, a reflow process is carried out to remove an oxide film on a surface of the solder plating layer (the solder layer 31C in the later process) and to form a solder electrode 31CZ in a substantially semispherical shape (FIG. 2D). Examples of methods may include a method in which flux is coated entirely and then heated, or a method in which heating is carried out under an atmosphere of formic acid. In a case that polyimide is used as the organic film 33Z, the following method may be suitable; the entire wafer 10Z is heated to about 250° C. under the atmosphere of formic acid to remove the oxide film on the surface of the solder plating layer (the solder layer 31C in the later process) and to allow the solder plating layer to melt. This is for preventing flux residue on the organic film 33Z. Thereafter, water washing processing is carried out to remove residue or foreign matters that are attached to the surface of the wafer 10Z.

Next, a part on a rear surface side of the wafer 10Z (a part on the rear surface 11B side of the semiconductor substrate 11) is removed by grinding to process the semiconductor substrate 11 to an arbitrary thickness. Further, the wafer 10Z is mounted on a dicing frame using a dicing tape, following which, the wafer 10Z is divided with a dicing machine or the like to obtain the semiconductor chip 10.

The semiconductor chip 20 may be formed similarly. Then, the semiconductor chip 10 and the semiconductor chip 20 are arranged face to face to be connected to each other. Specifically, a camera is interposed between the semiconductor chip 10 and the semiconductor chip 20 to read alignment marks, which are formed in advance, for performing alignment. Then, an appropriate load and heat are applied. Thus, the solder electrode 31CZ on the barrier metal 31A and the solder electrode 31CZ on the barrier metal 31B are joined together. To be more specific, first, the semiconductor chip 10 and the semiconductor chip 20 are heated to a temperature where the solder electrode 31CZ does not melt (about 200° C.). Next, after applying a load of about several N, the temperature of the semiconductor chip 20 is raised to a solder melting point or above, and then the state is maintained for, for example, about 20 seconds. At this occasion, mechanical vibration is applied using ultrasonic waves or the like, to remove the oxide film on the surface of the solder electrode 31CZ. By allowing a reducing gas such as formic acid to flow, joining of the solder electrode 31CZ on the barrier metal 31A and the solder electrode 31CZ on the barrier metal 31B may be performed more favorably.

Figure 2E:
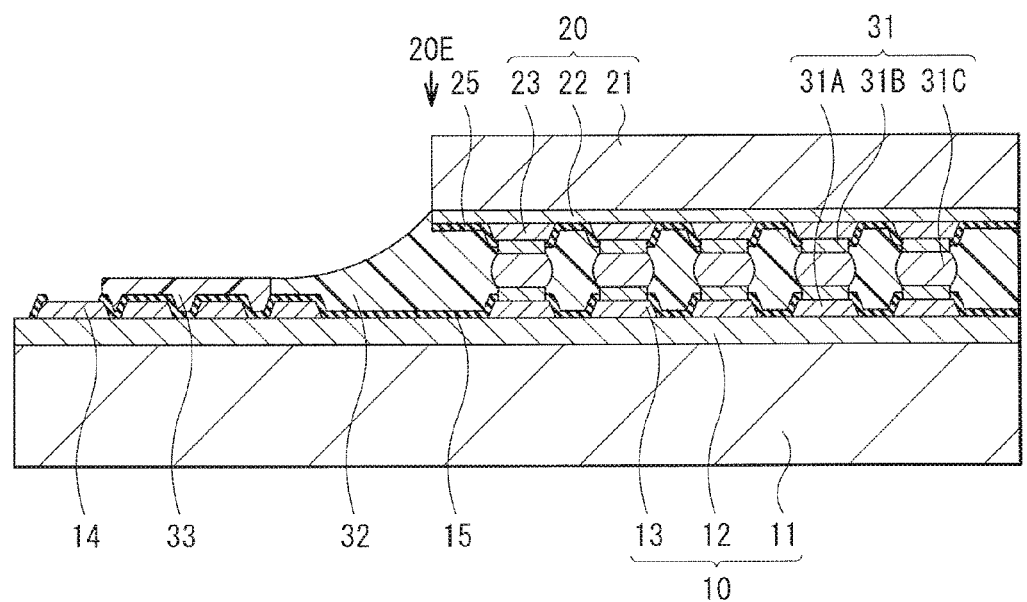
FIG. 2E is a cross-sectional view illustrating a process following FIG. 2D.

Subsequently, as illustrated in FIG. 2E, a sealing resin to form the sealing resin layer 32 is injected and filled between the semiconductor chip 10 and the semiconductor chip 20. Here, as the sealing resin, for example, a thermosetting resin is dropped on the protective film 15 formed on the front surface of the semiconductor chip 10. The thermosetting resin dropped on the protective film 15 in the peripheral region R2 reaches an end portion 20E of the semiconductor chip 20, and then permeates between the semiconductor chip 10 and the semiconductor chip 20 by a capillary phenomenon. Here, even in a case that a dropping speed is higher than a permeation speed by a capillary phenomenon, the dam 33 blocks the thermosetting resin, preventing extension thereof from the peripheral region R2 to other regions. Without the dam 33, the surplus thermosetting resin fails in pooling in the peripheral region R2 and wettedly spreads to the periphery. In this case, there occurs shortage of the thermosetting resin that is supposed to be filled between the semiconductor chip 10 and the semiconductor chip 20, causing a void in the sealing resin layer 32. In the present embodiment, provision of the dam 33 allows such a disadvantage to be avoided.

Next, the thermosetting resin is cured by heating at a predetermined temperature to obtain the sealing resin layer 32. Then, the rear surface 11B of the semiconductor substrate 11 and the front surface 41A of the circuit board 41 are adhered with the adhesive layer 34 in between. Further, by wire bonding, the lead wire 42 and the lead-out electrode 14 are connected through the wire 43 (FIG. 1A).

Subsequently, the circuit board 41 is set in a die, and a molding resin is injected while applying heat and molded to cover the entirety integrally by the molded resin layer 44. Thereafter, flux is transferred to the rear surface electrode 46 on the circuit board 41, and a solder ball (not illustrated) is mounted, following which, a reflow process is carried out to form an external electrode (not illustrated). Finally, singularization is carried out for separation in each package size.

Thus, the semiconductor device 1 is completed.

[Functions and Effects of Semiconductor Device 1]

In the semiconductor device 1 and the method of manufacturing the semiconductor device 1, the dam 33 configured of an organic film pattern is provided surrounding the sealing resin layer 32 that is filled in the gap between the semiconductor chip 10 and the semiconductor chip 20. This allows sufficient prevention of an outflow of the sealing resin layer 32 by a function of the dam 33 in the manufacturing process. As a result, it is possible to avoid the use of surplus sealing resin and to prevent an outer region of the peripheral region R2 from being contaminated by the sealing resin.

Moreover, since the dam 33 is configured of an organic material, the dam 33 has a high affinity to the molded resin layer 44. This leads to enhanced adhesion of the molded resin layer 44 and the dam 33, resulting in enhanced adhesion of the semiconductor chip 10 and the molded resin layer 44, as compared to a case that a metal dam is formed by plating or the like on a surface of the protective film 15 as an uppermost layer of the semiconductor chip 10.

Further, providing the dam 33 on the semiconductor substrate 11 in the semiconductor chip 10 contributes to reduction in area where the semiconductor chip 10 is in direct contact with the molded resin layer 44. Accordingly, the semiconductor chip 10 becomes less likely to be affected by stress resulting from curing shrinkage of the molded resin layer 44. Moreover, in a case that the molded resin layer 44 contains fillers, providing the dam 33 allows mechanical damage to the semiconductor chip 10 caused by the fillers contained in the molded resin layer 44 to be relieved.

Further, in the opposite region R1 where the semiconductor chip 10 and the semiconductor chip 20 overlap, no organic film pattern such as the dam 33 is provided. This makes it possible to enhance a heat dissipation characteristic, as compared to a case that the organic film pattern is formed entirely, and to avoid an increase in a total thickness of the semiconductor device 1.

Moreover, supposing that the dam 33 is formed with a plating film using a solder material, there is a possibility of damage to the protective film 15 as the uppermost layer of the semiconductor chip 10 due to internal stress that occurs in forming the plating film, causing a crack. Further, the dam 33 melts also in a reflow process after package assembly, causing concern that a plurality of lead-out electrodes 14 are short-circuited to one another in a case that there is a slight space between the surface of the semiconductor chip 10 and the molded resin layer 44. However, no such a disadvantage is involved in the semiconductor device 1 according to the present embodiment.

Furthermore, the height of the dam 33 is smaller than the height of the connection terminal 31, and at the boundary K, the upper surface 32S of the sealing resin layer 32 and the upper surface 33S of the dam 33 are adjusted to substantially coincide with each other. Accordingly, the dam 33 does not inhibit sealing by the molded resin layer 44, avoiding sufficiently occurrence of a void inside the molded resin layer 44, as compared to a case that the dam 33 has, for example, a same height as that of the connection terminal 31.

As described above, according to the semiconductor device 1 and the method of manufacturing thereof, it is possible to secure excellent operation reliability or long-term reliability and to attain high integration.

Second Embodiment

Configuration of Semiconductor Device 2

Figure 3A:
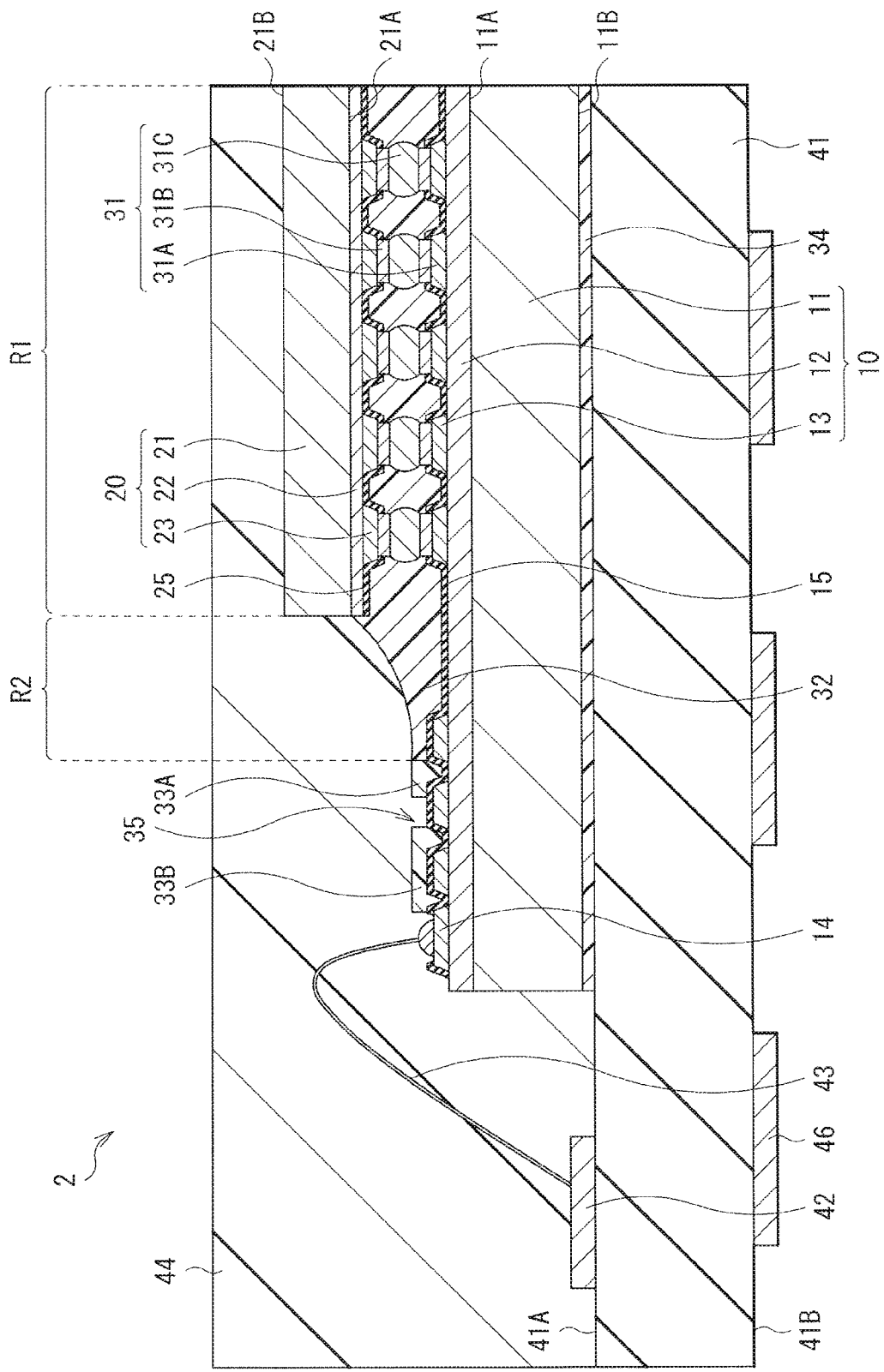
FIG. 3A is a cross-sectional view illustrating one configuration example of a semiconductor device according to a second embodiment of the present disclosure.
Figure 3B:
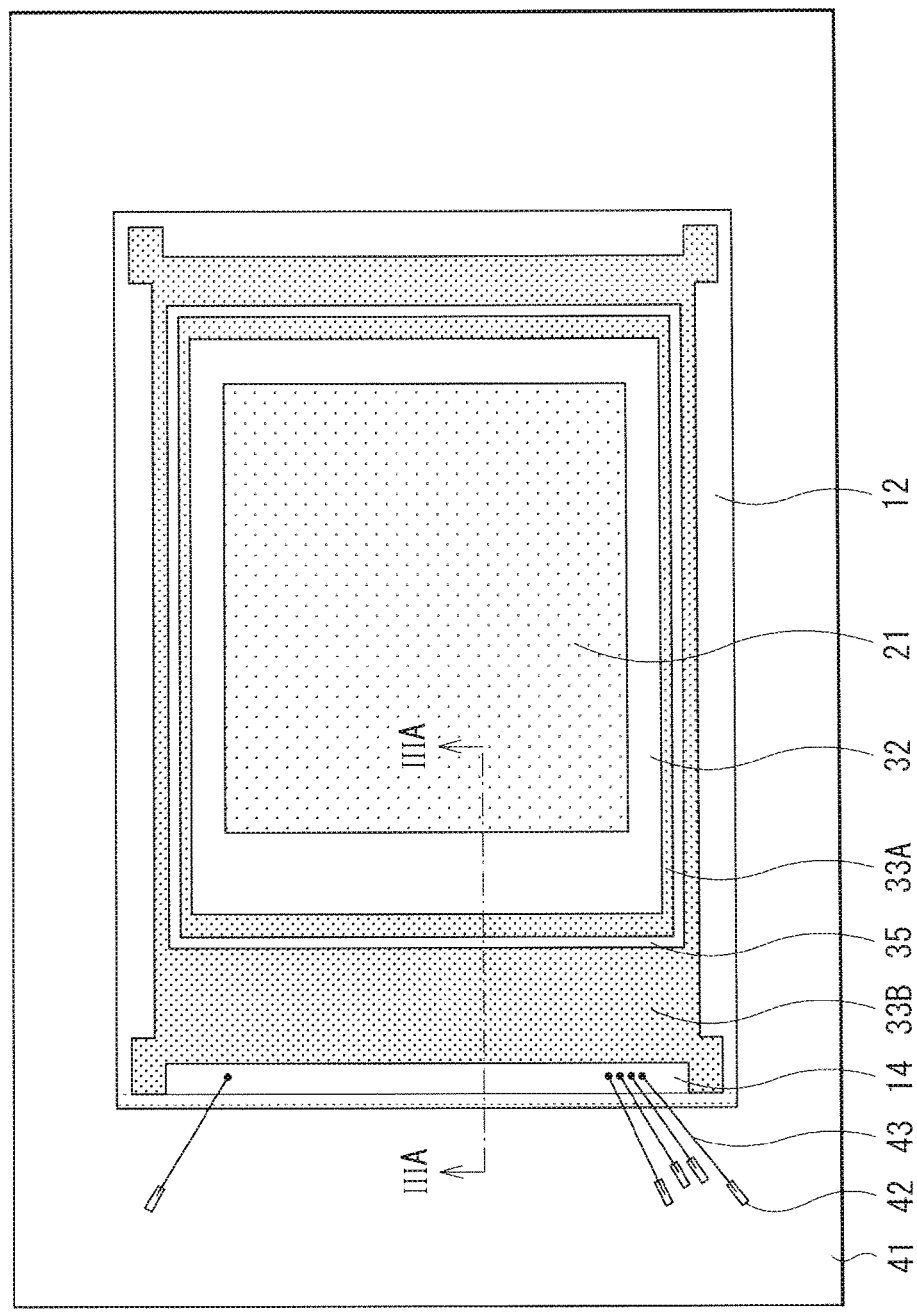
FIG. 3B is a plan view illustrating a semiconductor device according to a first modification example of the present disclosure.

FIG. 3A illustrates a cross-sectional configuration of a semiconductor device 2 according to a second embodiment of the present disclosure. FIG. 3B illustrates a planar configuration of the semiconductor device 2. FIG. 3A corresponds to a cross-section along a cutting line IIIA-IIIA illustrated in FIG. 3B, as seen in the direction of the arrows. In the semiconductor device 2, the dam 33 includes an inner circumferential portion 33A and an outer circumferential portion 33B that are divided by an annular groove 35. A width of the inner circumferential portion 33A may be, for example, 20 μm, while a width of the groove 35 may be, for example, 30 μm.

[Functions and Effects of Semiconductor Device 2]

In the semiconductor device 2, the inner circumferential portion 33A and the outer circumferential portion 33B each function as a dam separately and independently. In other words, when a resin such as a thermosetting resin or the like as a constituent material of the sealing resin layer 32 is fed from the peripheral region R2, even if the sealing resin flows out of the peripheral region R2 to rise over the inner circumferential portion 33A, it is possible to block the sealing resin by the groove 35. Consequently, it is possible to sufficiently avoid contamination of an outer region of the outer circumferential portion 33B due to the sealing resin, even in a case that, for example, the surface of the protective film 15 has insufficient wettability, or in a case that there occurs a change in intrusion speed of the sealing resin. In other word, in the semiconductor device 2, it is possible to demonstrate effects as a dam more stably, attaining an improved yield and enhanced product quality.

It is to be noted that FIGS. 3A and 3B illustrate an example in which one groove 35 is provided and the dam 33 is divided into two portions, but the present technology is not limited thereto. Alternatively, two or more grooves may be provided and the dam 33 may be divided into three or more portions.

Third Embodiment

Configuration of Semiconductor Device 3

Figure 4:
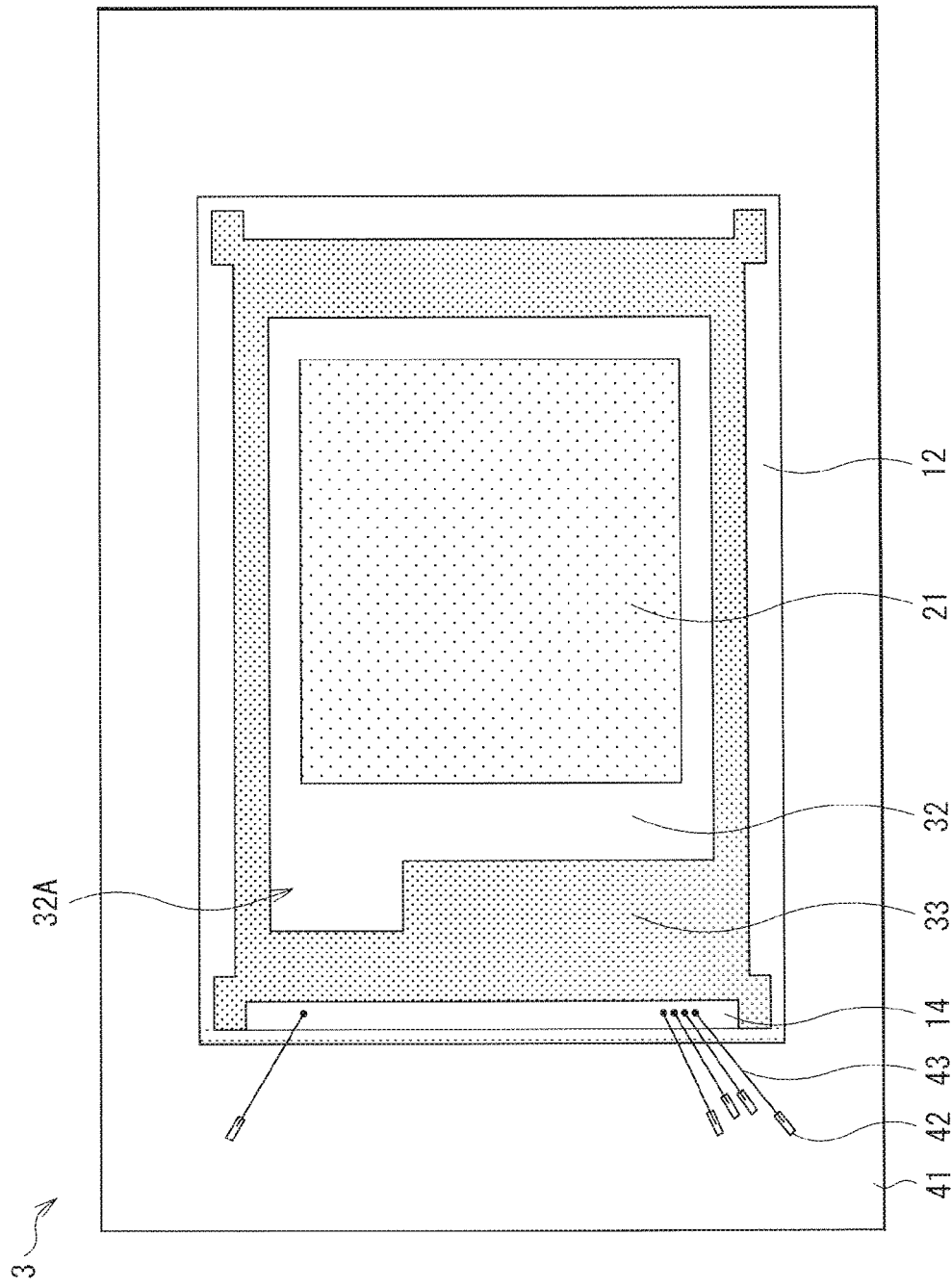
FIG. 4 is a plan view illustrating one configuration example of a semiconductor device according to a third embodiment of the present disclosure.

FIG. 4 illustrates a planar configuration of a semiconductor device 3 according to a third embodiment of the present disclosure. The semiconductor device 3 involves partial extension of the peripheral region R2. In the semiconductor device 3, the sealing resin layer 32 includes an extended portion 32A that occupies the extended portion of the peripheral region R2.

[Functions and Effects of Semiconductor Device 3]

In this way, when the sealing resin layer 32 is formed, it is possible to prevent an outflow of the sealing resin externally of the dam 33 even when the dropping speed of the sealing resin is increased. Further, increasing the dropping speed of the sealing resin causes an increase in pressure of the intruding sealing resin. As a result, a difference in speed by a capillary phenomenon between a region with the faster intrusion and a region with the slower intrusion is reduced, preventing air from involved inside the sealing resin layer 32. This makes it possible to form the sealing resin layer 32 in a shorter time, and to prevent occurrence of a void inside the sealing resin layer 32.

Modification Example 1

Configuration of Semiconductor Device 3A

Figure 5:
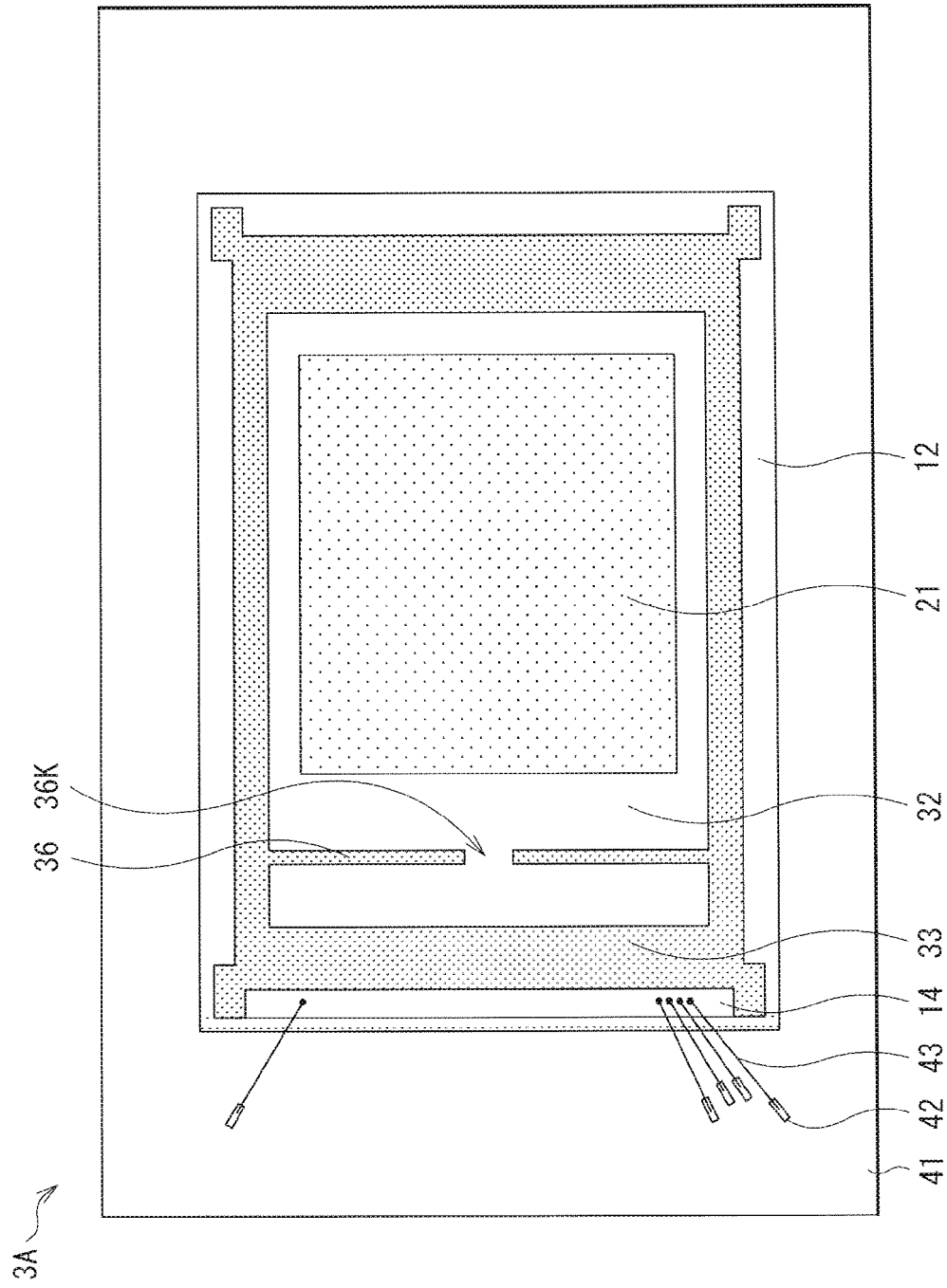
FIG. 5 is a plan view illustrating a modification example of the semiconductor device according to the third embodiment of the present disclosure.

FIG. 5 illustrates a planar configuration of a semiconductor device 3A according to a modification example of the above-described semiconductor device 3 (a first modification example of the present disclosure). In the semiconductor device 3A, a barrier rib 36 is provided in a part of the peripheral region R2, and an opening 36K is provided in a part of the barrier rib 36. The barrier rib 36 may be formed integrally with the dam 33 using, for example, photolithography.

[Functions and Effects of Semiconductor Device 3A]

Also in the semiconductor device 3A as configured above, it is possible to achieve similar effects to those of the above-described third embodiment.

Fourth Embodiment

Configuration of Semiconductor Device 4

Figure 6B:
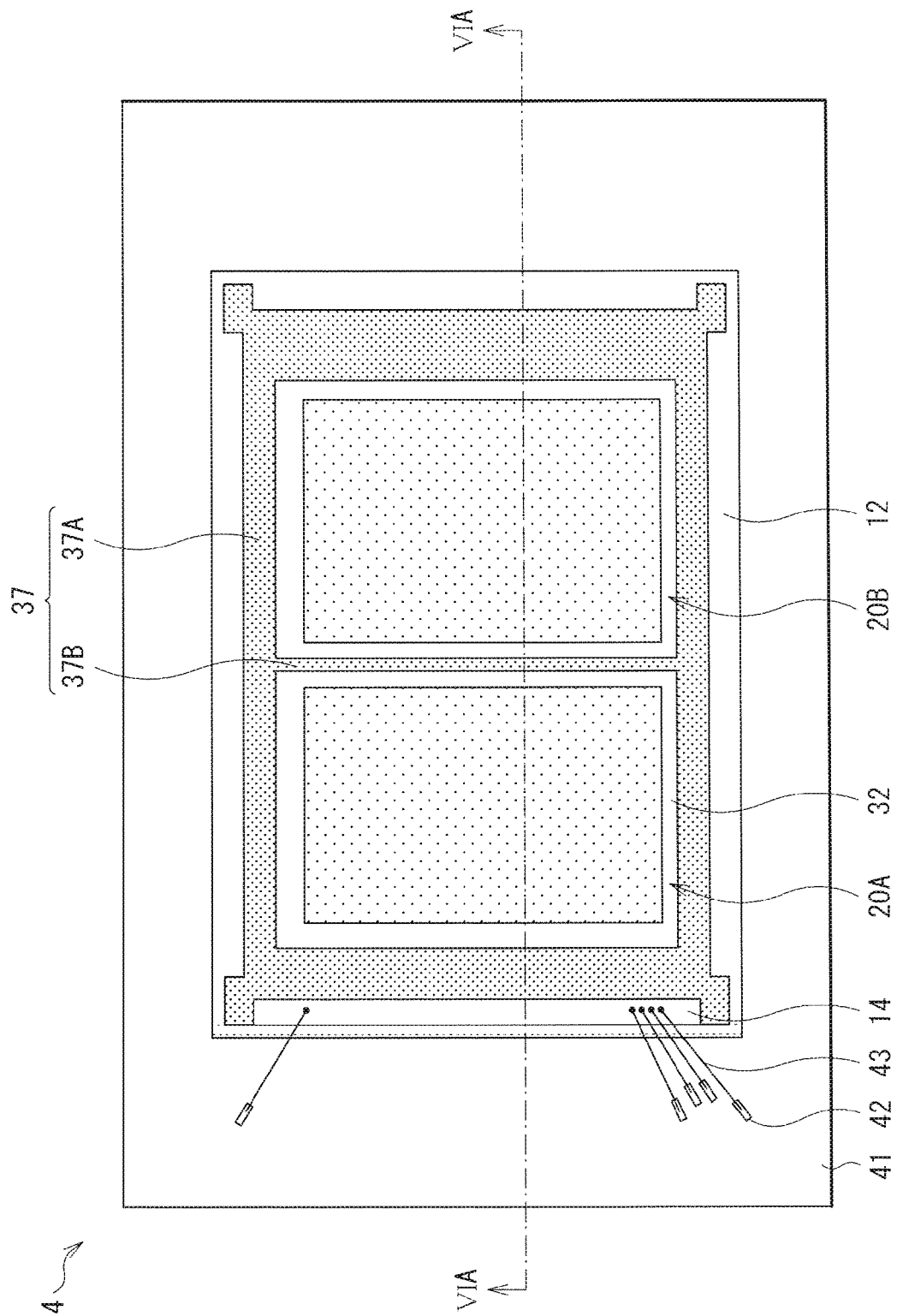
FIG. 6B is a plan view illustrating one configuration example of the semiconductor device illustrated in FIG. 6A.

FIG. 6A illustrates a cross-sectional configuration of a semiconductor device 4 according to a fourth embodiment of the present disclosure. FIG. 6B illustrates a planar configuration of the semiconductor device 4. FIG. 6A corresponds to a cross-section along a cutting line VIA-VIA illustrated in FIG. 6B, as seen in the direction of the arrows. The semiconductor device 4 has a configuration in which two semiconductor chips 20A and 20B are joined onto one semiconductor chip 10. As a result, the semiconductor device 4 includes a dam 37 instead of the dam 33. The dam 37 includes an annular portion 37A and a beam portion 37B. The annular portion 37A corresponds to the peripheral region R2 that surrounds the two semiconductor chips 20A and 20B. The beam portion 37B corresponds to a region R3 between the semiconductor chip 20A and the semiconductor chip 20B. Otherwise, the semiconductor device 4 has a similar configuration to that of the semiconductor device 1 according to the above-described first embodiment.

[Functions and Effects of Semiconductor Device 4]

In the semiconductor device 4, the two semiconductor chips 20A and 20B are arranged facing the one semiconductor chip 10, and the dam 37 is provided in a shape that surrounds each of the semiconductor chips 20A and 20B. In this way, it is possible to avoid occurrence of a void inside the sealing resin layer 32 more sufficiently. In other words, when a plurality of semiconductor chips are mounted, it is possible to restrain occurrence of a void by forming a dam according to shapes of the respective semiconductor chips. One reason is as follows. For example, when the sealing resin intrudes by a capillary phenomenon through the peripheral region R2 that surrounds the semiconductor chip 20A, the intrusion speed of the sealing resin varies according to surface patterns of the semiconductor chip 20A and the semiconductor chip 10. That is, the sealing resin, which reaches the semiconductor chip 20B through a gap between the semiconductor chip 20A and the semiconductor chip 10, does not intrude into the chip uniformly, but tends to involve air. Accordingly, by adopting the dam 37 having a shape that surrounds each of the semiconductor chips 20A and 20B, it is possible to form the sealing resin layer 32 in a shorter time, and to prevent occurrence of a void inside the sealing resin layer 32.

It is to be noted that, in a case that the dam is formed with a solder material, it is difficult to form a dam in a shape that includes a branched portion as the dam 37. This is because remelting of the solder material causes a force that minimizes surface tension of the dam. Moreover, in a case of forming two dams spaced from each other with the solder material, a space of, for example, at least about 40 μm is necessary. Therefore, more area is to be occupied, inhibiting reduction in size. On the other hand, in the semiconductor device 4, the dam 37 is configured of an organic film pattern. This makes it possible to form the dam 37 in a smaller size and in a more complicated shape. And no disadvantages arise as in the case of using the above-mentioned solder material.

Fifth Embodiment

Configuration of Semiconductor Device 5

Figure 7A:
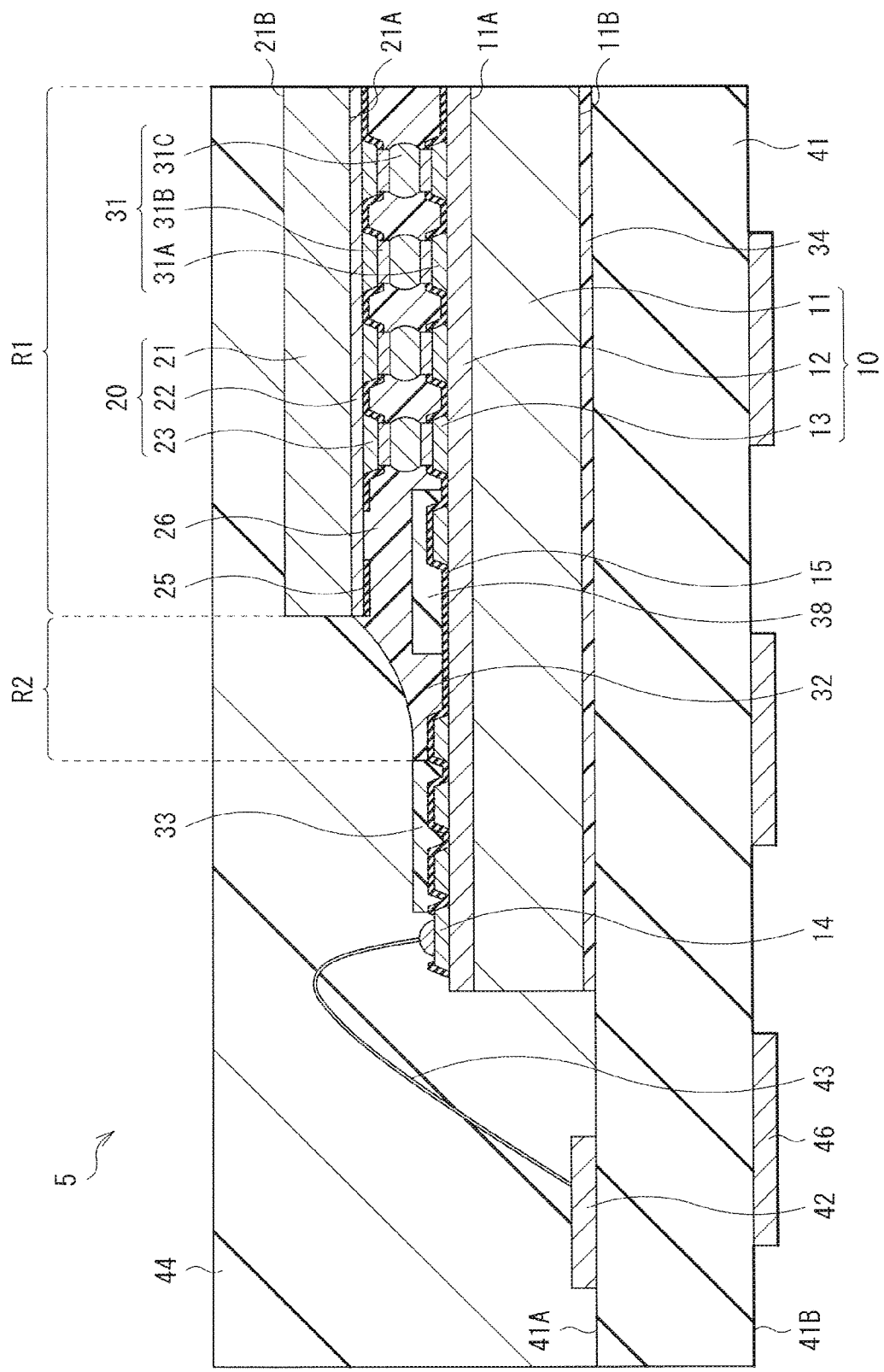
FIG. 7A is a cross-sectional view illustrating one configuration example of a semiconductor device according to a fifth embodiment of the present disclosure.
Figure 7B:
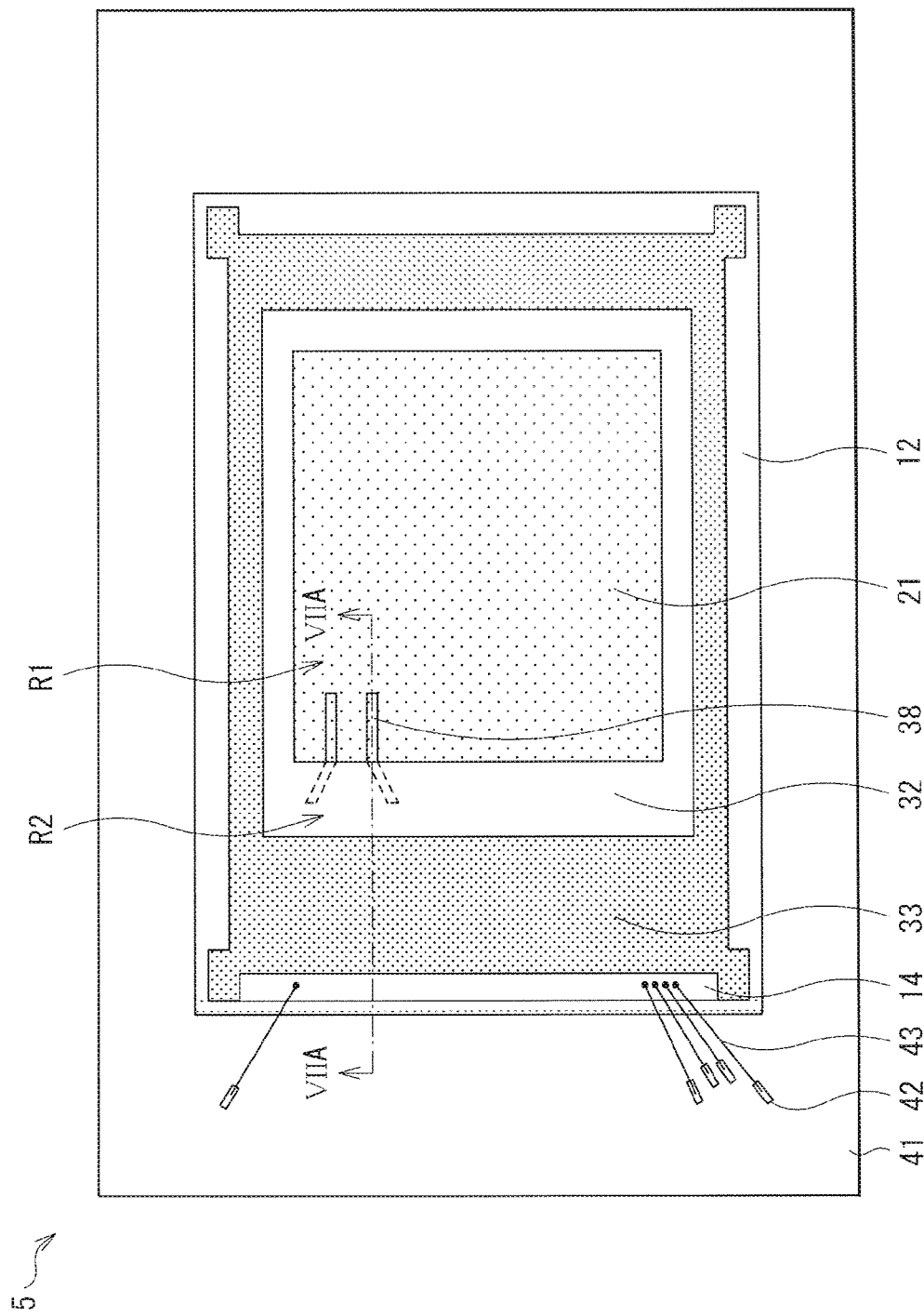
FIG. 7B is a plan view illustrating one configuration example of the semiconductor device illustrated in FIG. 7A.

FIG. 7A illustrates a cross-sectional configuration of a semiconductor device 5 according to a fifth embodiment of the present disclosure. FIG. 7B illustrates a planar configuration of the semiconductor device 5. FIG. 7A corresponds to a cross-section along a cutting line VIIA-VIIA illustrated in FIG. 7B, as seen in the direction of the arrows. The semiconductor device 5 involves a guide 38 that runs from the peripheral region R2 to reach the opposite region R1. The guide 38 may be configured of an organic material similarly to the dam 33, and may have a same height as that of the dam 33. Otherwise, the semiconductor device 5 has a similar configuration to that of the semiconductor device 1 according to the above-described first embodiment.

[Functions and Effects of Semiconductor Device 5]

In the semiconductor device 5, since the guide 38 made of an organic material is provided, it is possible to effectively prevent occurrence of a void inside the sealing resin layer 32. For example, in a case that the upper semiconductor chip 20 is a DRAM, as illustrated in FIGS. 7A and 7B, there may be provided a recessed portion 26 that is slightly recessed because a fuse has been cut. The sealing resin, which constitutes the sealing resin layer 32, is less likely to flow in such a place (the recessed portion 26), which often causes occurrence of a void in the sealing resin layer 32. Therefore, by providing the guide 38, it is possible to control an intrusion route of the sealing resin, to increase the pressure of the sealing resin that intrudes the opposite region R1 from the peripheral region R2, and to restrain occurrence of a void in the sealing resin layer 32.

Although description has been made by giving the example embodiments as mentioned above, the contents of the present disclosure are not limited to the above-mentioned example embodiments and may be modified in a variety of ways.

For example, the first substrate on the lower side is not limited to those that include semiconductor circuit devices. It is possible to obtain similar effects with those that have no active devices, for example, a silicon interposer.

Figure 8:
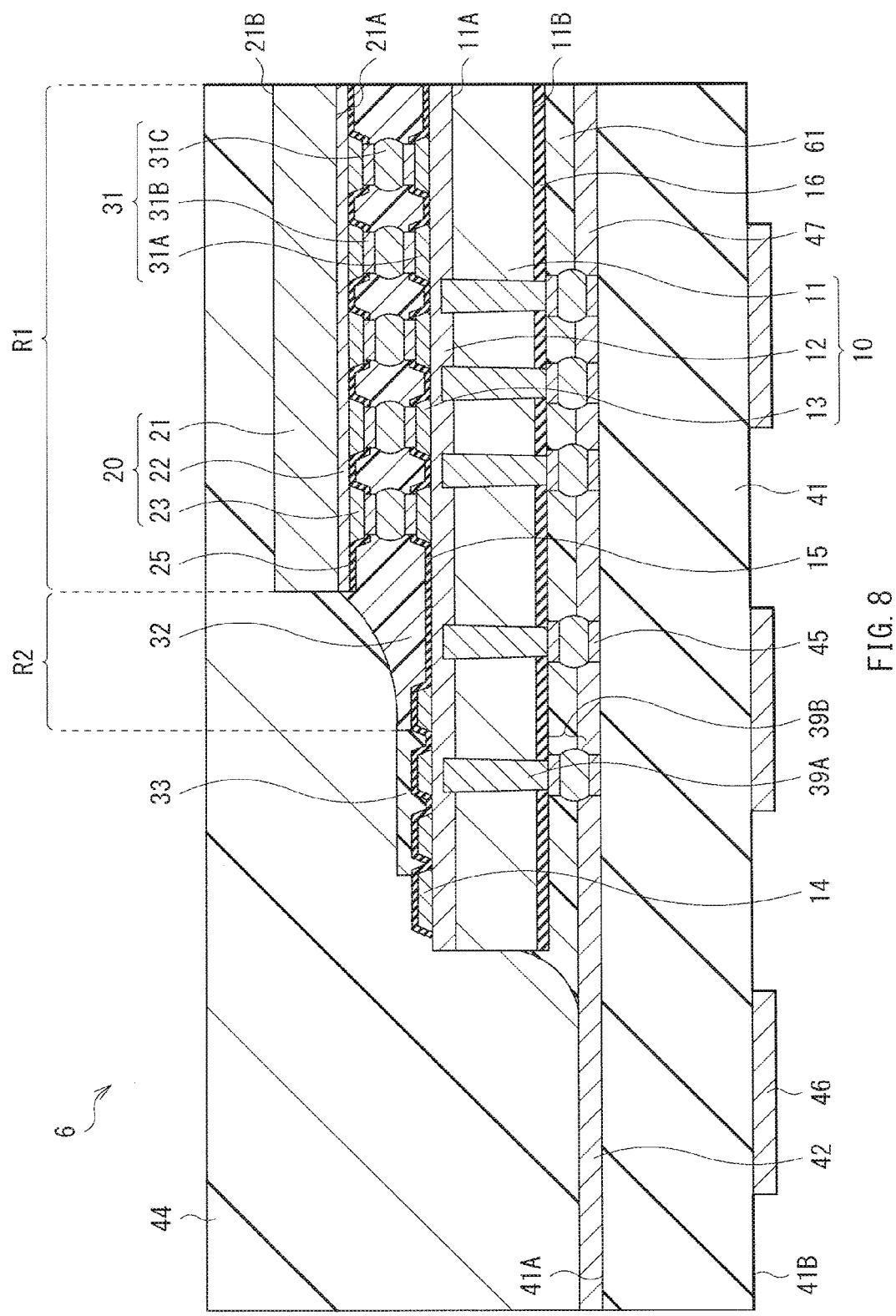
FIG. 8 is a cross-sectional view illustrating a semiconductor device according to a second modification example of the present disclosure.

Moreover, it is not necessary for the first substrate to include a pad for wire bonding. For example, the first substrate may be configured as in a semiconductor device 6 according to a second modification example of the present disclosure, as illustrated in FIG. 8. Specifically, the circuit forming layer 12 of the semiconductor chip 10 and a surface electrode 45 may be connected to each other through a via 39A and a connection terminal 39B. The surface electrode 45 is embedded in a circuit forming layer 47 that covers a front surface 41A of the circuit board 41. The via 39A and the connection terminal 39B penetrate the semiconductor substrate 11. Here, the rear surface 11B of the semiconductor substrate 11 is covered with a protective film 16. Moreover, in a gap between the protective 16 and the circuit forming layer 47, a sealing resin layer 61 is filled. Accordingly, each connection terminal 39B is surrounded by the sealing resin layer 61.

Figure 9:
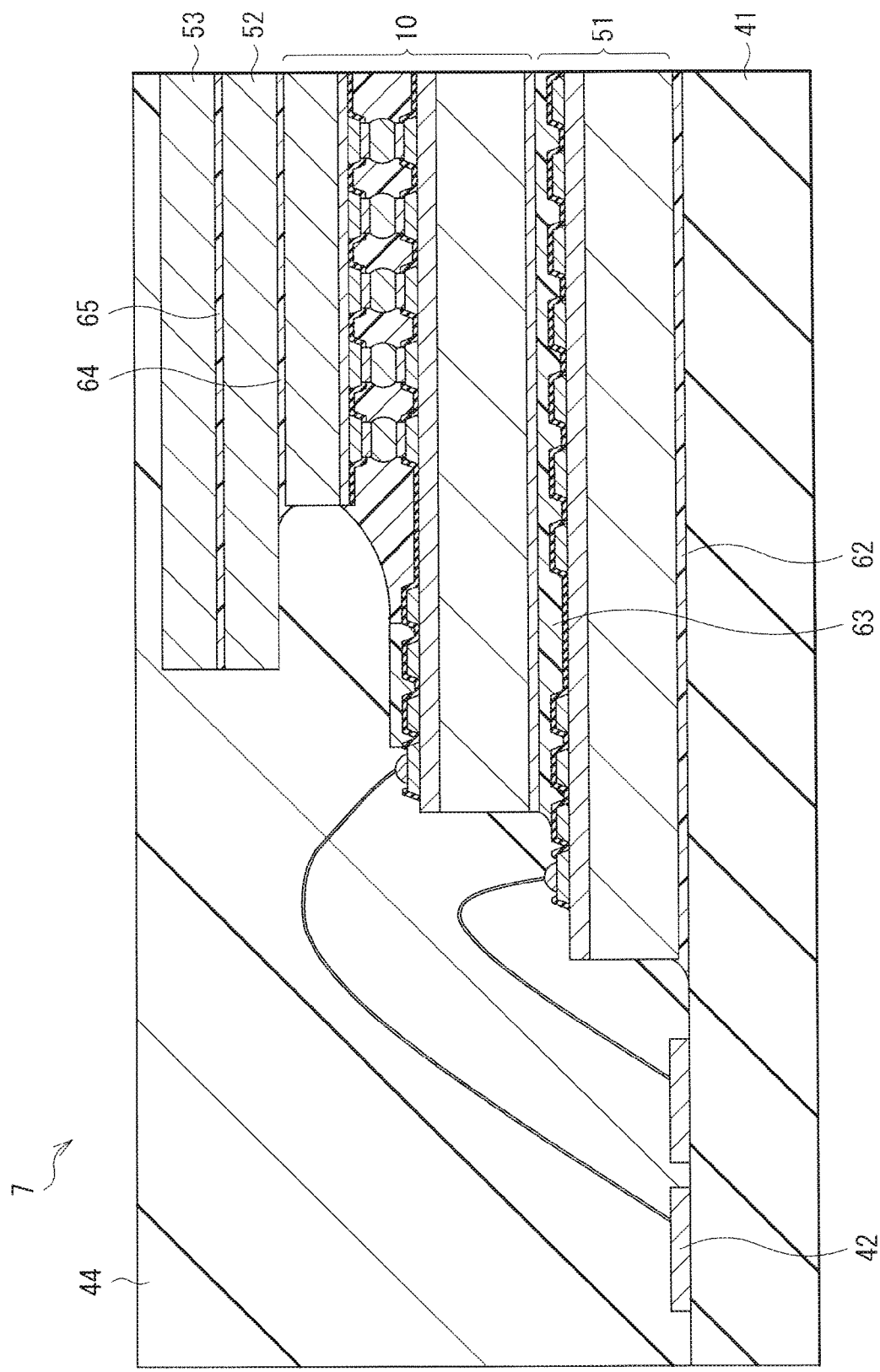
FIG. 9 is a cross-sectional view illustrating a semiconductor device according to a third modification example of the present disclosure.

Furthermore, a chip-on-chip semiconductor device according to the present technology may be mounted on a circuit board together with any other semiconductor component or other semiconductor components. In this case, this is not limited to a case that the chip-on-chip semiconductor device is disposed in the lowermost stage in the structural body on the circuit board. For example, as in a semiconductor device 7 according to a third modification example of the present disclosure, as illustrated in FIG. 9, another semiconductor component 51 may be mounted on the circuit board 41, and the semiconductor device 1 according to the example embodiment of the present disclosure may be mounted on the semiconductor component 51. Furthermore, on the semiconductor device 1, other devices 52 and 53 may be mounted. Here, the circuit board 41 and the semiconductor component 51 may be adhered by an adhesive layer 62. The semiconductor component 51 and the semiconductor chip 10 may be adhered by an adhesive layer 63. The semiconductor chip 10 and the device 52 may be adhered by an adhesive layer 64. The device 52 and the device 53 may be adhered by an adhesive layer 65. The adhesive layers 62 to 65 may be configured of a die bond material.

It is to be noted that effects described herein are illustrative and non-limiting, and effects of the present disclosure may be other effects or may further include other effects. Moreover, it is possible to achieve at least the following configurations from the above-described example embodiments of the disclosure.

(1) A semiconductor device, including:
a first substrate that includes a first wiring;
a second substrate that is disposed facing the first substrate and includes a second wiring, the second wiring being connected to the first wiring through a connection terminal, and the second substrate being smaller in area than the first substrate;
a first resin layer that is filled in a gap between the first substrate and the second substrate and covers a region, on the first substrate, in an outer periphery of the second substrate;
an organic film pattern that is provided on the first substrate and surrounds the first resin layer; and
a second resin layer that covers the first substrate, the organic film pattern, the first resin layer, and the second substrate.

(2) The semiconductor device according to (1),
wherein the first substrate further includes a protective film as an uppermost layer.

(3) The semiconductor device according to (1) or (2),
wherein at a boundary between the organic film pattern and the first resin layer, a positional level of an upper surface of the organic film pattern coincides with a positional level of an upper surface of the first resin layer.

(4) The semiconductor device according to any one of (1) to (3), further including a lead-out electrode that is provided on an upper surface of the first substrate,
wherein the organic film pattern includes one of a notch and an opening in a region in which the organic film pattern overlaps the lead-out electrode.

(5) The semiconductor device according to (4), further including a circuit board that is provided on an opposite side to the second substrate with the first substrate in between, the circuit board being connected to the first substrate,
wherein the lead-out electrode is connected, by a wire, to a wiring layer that is provided on the circuit board.

(6) The semiconductor device according to any one of (1) to (5),
wherein a thickness of the organic film pattern is smaller than a distance between the first substrate and the second substrate.

(7) The semiconductor device according to any one of (1) to (6),
wherein one or both of the first substrate and the second substrate is a semiconductor chip.

(8) A method of manufacturing a semiconductor device, the method including:
forming, on a first substrate that includes a first wiring, an organic film pattern that includes an opening;
connecting the first wiring to a second wiring of a second substrate through a connection terminal, the second substrate being disposed in a region, on the first substrate, that faces the opening of the organic film pattern;
filling a first resin layer in a gap between the first substrate and the second substrate; and
forming a second resin layer that covers the first substrate, the organic film pattern, the first resin layer, and the second substrate.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
a layer of electrically conductive first wiring that is between a first circuit forming layer of a first semiconductor substrate and an electrically insulative first protective film, the first circuit forming layer touches a portion of the first wiring;
a layer of electrically conductive second wiring that is between an electrically insulative second protective film and a second circuit forming layer of a second semiconductor substrate smaller than the first semiconductor substrate, the second circuit forming layer touches a portion of the second wiring;
a conductive connection terminal that is between the portion of the first wiring and the portion of the second wiring, the portion of the first wiring and the portion of the second wiring touch the conductive connection terminal;
a lead-out electrode that touches the first circuit forming layer, the lead-out electrode is provided outside of a peripheral region of the first semiconductor substrate having a segment of the first wiring between the lead-out electrode and the portion of the first wiring;
a resin layer that is between the first protective film and the second protective film, the conductive connection terminal is in the resin layer and the resin layer covers the peripheral region, an opposite region that faces the second semiconductor substrate and a portion of the segment of the first wiring in a cross-sectional view uniformly surround the second semiconductor substrate in a plan view;
an organic film that touches the resin layer and the lead-out electrode, the organic film completely covers a remaining portion of the segment of the first wiring outside the peripheral region,
wherein the resin layer is a material that is different from the organic film,
wherein the first protective film is between the organic film and the remaining portion of the segment of the first wiring.

2. The semiconductor device according to claim 1, wherein the first protective film physically isolates the organic film from the first wiring.

3. The semiconductor device according to claim 1, wherein the resin layer fills a gap between the first circuit forming layer and the second circuit forming layer, the conductive connection terminal is in the gap.

4. The semiconductor device according to claim 1, wherein the organic film is a photosensitive polyimide resin.

5. The semiconductor device according to claim 4, wherein the resin layer is a thermosetting resin.

6. The semiconductor device according to claim 1, wherein the first protective film resin layer is an inorganic film.

7. The semiconductor device according to claim 6, wherein the inorganic film is silicon oxide.

8. The semiconductor device according to claim 6, wherein the inorganic film is silicon nitride.

9. The semiconductor device according to claim 1, wherein the second protective film resin layer is an inorganic film.

10. The semiconductor device according to claim 9, wherein the inorganic film is silicon oxide.

11. The semiconductor device according to claim 9, wherein the inorganic film is silicon nitride.

12. The semiconductor device according to claim 1, wherein the resin layer touches the first protective film and the second protective film.

13. The semiconductor device according to claim 1, wherein transistors are in the first circuit forming layer.

14. The semiconductor device according to claim 1, wherein transistors are in the second circuit forming layer.

15. The semiconductor device according to claim 1, further comprising:
   another resin layer that encases the organic film and a wire,
      the wire electrically connects the lead-out electrode to a circuit board.

16. The semiconductor device according to claim 15, wherein the first circuit forming layer is between the circuit board and the second circuit forming layer.

\* \* \* \* \*